(12) United States Patent
Choi

(10) Patent No.: US 12,294,235 B2
(45) Date of Patent: May 6, 2025

(54) ELECTRONIC DEVICE FOR CHARGING BATTERY BASED ON VOLTAGE OF INTERFACE AND METHOD FOR CONTROLLING SAME

(71) Applicant: Samsung Electronics Co., Ltd., Suwon-si (KR)

(72) Inventor: Hangseok Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 650 days.

(21) Appl. No.: 17/555,852

(22) Filed: Dec. 20, 2021

(65) Prior Publication Data

US 2022/0200310 A1     Jun. 23, 2022

Related U.S. Application Data

(63) Continuation of application No. PCT/KR2021/019269, filed on Dec. 17, 2021.

(30) Foreign Application Priority Data

Dec. 23, 2020 (KR) .................. 10-2020-0182455

(51) Int. Cl.
    *H02J 7/00*     (2006.01)

(52) U.S. Cl.
    CPC ....... *H02J 7/00712* (2020.01); *H02J 7/00711* (2020.01)

(58) Field of Classification Search
    CPC ........ H02J 2207/20; H02J 50/12; H02J 50/70; H02J 50/90; H02J 7/00; H02J 50/60;
(Continued)

(56) References Cited

U.S. PATENT DOCUMENTS 9,960,618 B1 *   5/2018   Razdan .................. H02J 7/007
10,256,648 B1     4/2019   Razdan et al.
(Continued)

FOREIGN PATENT DOCUMENTS

CN     110518673     11/2019
CN     110620411     12/2019
(Continued)

OTHER PUBLICATIONS

Extended European Search Report dated Mar. 20, 2024 issued in European Patent Application No. 21911410.5.
(Continued)

*Primary Examiner* — Binh C Tat
(74) *Attorney, Agent, or Firm* — Nixon & Vanderhye P.C.

(57) ABSTRACT

Disclosed are an electronic device for charging a battery based on a voltage of an interface and a method for controlling the same. The electronic device for charging a battery based on a voltage of an interface, according to an embodiment, may include: an interface comprising a conductive piece, a current reference control circuit; and a charging current control circuit configured to control the magnitude of a charging current applied to the interface, based on a control signal resulting from a comparison between a charging current value applied to the interface and a first critical current value configured in the current reference control circuit, wherein the current reference control circuit is configured to, based on a voltage value applied to the interface reaching a first critical voltage value, gradually decrease the first critical current value until the voltage value applied to the interface falls below the first critical voltage value, and maintain the first critical current value based on the voltage value applied to the interface being less than the first critical voltage value.

20 Claims, 11 Drawing Sheets

(58) Field of Classification Search
CPC ........ H02J 50/80; H02J 9/061; H02J 7/00036; H02J 7/00047; H02J 7/345; H02J 7/0016; H02J 7/007182; H02J 7/04; H02J 50/402; H02J 7/00308; H02J 7/007192; H02J 7/00306; H02J 7/00711; H02J 7/00712; H02J 9/062; H02J 3/06; H02J 50/20; H02J 50/27; H02J 7/00304; H02J 7/0047; H02J 2300/26; H02J 3/38; H02J 3/381; H02J 50/005; H02J 7/00309; H02J 7/0068; H02J 7/02; H02J 15/00; H02J 3/32; H02J 7/0032; H02J 7/0044; H02J 7/0048; H02J 7/0071; H02J 7/00714; H02J 7/007184; H02J 7/007194; H02J 7/34; H02J 9/067; H01L 29/7833; H01L 2924/13091
USPC .................................................. 320/139–145
See application file for complete search history.

(56) References Cited

U.S. PATENT DOCUMENTS

| | | | |
|---|---|---|---|
| 2012/0078278 A1* | 3/2012 | Bales, Jr. ....... | A61B 17/320092 307/116 |
| 2012/0212205 A1 | 8/2012 | Yamada | |
| 2014/0016239 A1 | 1/2014 | Kim et al. | |
| 2014/0145693 A1 | 5/2014 | Lee | |
| 2014/0184173 A1 | 7/2014 | Szepesi | |
| 2015/0229212 A1 | 8/2015 | Shiwaya | |
| 2016/0116925 A1* | 4/2016 | Freeman ........... | H02M 3/33515 307/130 |
| 2017/0018951 A1 | 1/2017 | Park | |
| 2018/0062413 A1 | 3/2018 | Zhang et al. | |
| 2018/0090942 A1 | 3/2018 | Nunez et al. | |
| 2019/0089174 A1 | 3/2019 | Zeng | |
| 2019/0123573 A1 | 4/2019 | Zhang et al. | |
| 2020/0064893 A1 | 2/2020 | Kirchner et al. | |

FOREIGN PATENT DOCUMENTS

| | | |
|---|---|---|
| JP | 05336679 | 12/1993 |
| JP | 2006/204021 | 8/2006 |
| JP | 2006-333616 | 12/2006 |
| JP | 2012-175868 | 9/2012 |
| JP | 2013-021815 | 1/2013 |
| JP | 2018-082511 | 5/2018 |
| KR | 10-2010-0078322 | 7/2010 |
| KR | 10-2013-0035242 | 4/2013 |
| KR | 10-2014-0066598 | 6/2014 |
| KR | 10-2014-0123688 | 10/2014 |
| KR | 10-2015-0084783 | 7/2015 |
| KR | 10-2015-0106274 | 9/2015 |
| KR | 10-1618640 | 4/2016 |
| KR | 10-2017-0059802 | 5/2017 |
| KR | 10-2017-0096831 | 8/2017 |
| WO | 2017/205575 | 11/2017 |

OTHER PUBLICATIONS

Search Report and Written Opinion issued Mar. 30, 2022 in counterpart International Patent Application No. PCT/KR2021/019269.

* cited by examiner

ELECTRONIC DEVICE FOR CHARGING BATTERY BASED ON VOLTAGE OF INTERFACE AND METHOD FOR CONTROLLING SAME

CROSS-REFERENCE TO RELATED APPLICATIONS

This application is a continuation of International Application No. PCT/KR2021/019269 designating the United States, filed on Dec. 17, 2021, filed in the Korean Intellectual Property Receiving Office and claiming priority to Korean Patent Application No. 10-2020-0182455, filed on Dec. 23, 2020, in the Korean Intellectual Property Office, the disclosures of which are incorporated by reference herein in their entireties.

BACKGROUND

Field

The disclosure relates to an electronic device for charging a battery based on a voltage of an interface, and a method for controlling the same.

Description of Related Art

There has been increasing use of electronic devices that are easy to carry, such as smartphones, tablet PCs, and wearable devices, and electronic devices have also been developed to be worn by users, in line with ever-increasing use of electronic devices, such that portability and user accessibility can be improved. As an example of such electronic device, an ear-wearable device (for example, earphone) can be worn on the user's ear, and such an electronic device may be driven by a chargeable/dischargeable battery.

Power may be supplied from a charging device (for example, cradle) using an interface (for example, POGO pin) provided on the housing of an electronic device (for example, ear-wearable device). If the battery voltage rises nearly to a fully-charged level, the ear-wearable device may execute charging with a predetermined voltage. For example, if the battery voltage reaches the target voltage in a constant current charging type, the charging mode may switch to a constant voltage charging type in which the current is reduced to suppress voltage increase, in order to guarantee that charging proceeds further without increasing the voltage.

A communication IC that uses a separate V_BUS may be added, or a separate element (for example, separate POGO terminal) may be added, in order to detect whether or not the battery voltage of the ear-wearable device reaches the target voltage, and to change the charging mode accordingly, but such an approach may increase the occupied area and increase the implementation cost in the case of an ear-wearable device which is aimed at compactness. In addition, if the ear-wearable device receives power through electric connection with a connection terminal (for example, POGO pin) of a charging device, there is insufficient space to allocate a separate pin. If constant-current charging and constant-voltage charging are performed based on a voltage output by a charging circuit (for example, charger of charging cradle), the output voltage of the charging circuit (for example, charger of charging cradle) reaches the target voltage before the battery voltage (for example, VCELL) reaches the target voltage, as the output voltage (for example, VCHGO) of the charging circuit is supplied to the battery. In this case, the charging current (ICELL) decreases, and such a charging type may require a long charging time. If a separate interface is allocated, or if power line communication is used, the electronic device (for example, charging cradle) may be difficult to implement, or may require an increased cost, because the separate pin for detecting the battery charging state or the additional element (for example, power line communication IC) increases the mounting space.

If a fixed voltage is applied, instead of allocating a separate interface, such that a linear charger included in an external electronic device senses the battery voltage/current, thereby charging the battery of the external electronic device through a constant-voltage/constant-current function, a relatively large difference between the interface voltage and the battery voltage may be maintained, and such a voltage difference may result in charging loss.

SUMMARY

Embodiments of the disclosure provide an electronic device capable of substantially reducing charging loss compared with FIG. 1C while exhibiting a charging performance substantially identical to the charging type illustrated in FIG. 1B or FIG. 1C without adding a separate interface for battery cell sensing other than conventional interfaces (for example, V_BUS terminal and GNG terminal) provided in the electronic device (for example, charging cradle) (in other words, without having to acquire battery cell voltage information by the electronic device (for example, charging cradle)).

Embodiments of the disclosure provide an electronic device capable of reducing charging loss, wherein the magnitude of charging current for charging the battery of an ear-wearable device is controlled with reference to whether or not an interface voltage (for example, POGO voltage) has reached a predesignated voltage (for example, first critical voltage), thereby reducing the difference between the charging voltage (VCHGO) and the battery cell voltage (VCELL) compared with the prior art.

Embodiments of the disclosure provide a method for controlling an electronic device, wherein a battery charging function or operation can be performed in such a manner that charging loss is substantially reduced compared with the charging type illustrated in FIG. 1C without adding a separate interface for battery cell sensing other than conventional interfaces (for example, V_BUS terminal and GNG terminal) provided in the electronic device (for example, charging cradle) (in other words, without having to acquire battery cell voltage information by the electronic device (for example, charging cradle)).

Embodiments of the disclosure provide a method for controlling an electronic device capable of reducing charging loss, wherein the magnitude of charging current for charging the battery of an ear-wearable device is controlled with reference to whether or not an interface voltage (for example, POGO voltage) has reached a predesignated voltage (for example, first critical voltage), thereby reducing the difference between the charging voltage (VCHGO) and the battery cell voltage (VCELL) compared with the prior art.

An electronic device according to an example embodiment of the disclosure may include: an interface including a conductive piece, a current reference control circuit, and a charging current control circuit configured to control a magnitude of a charging current applied to the interface based on a control signal resulting from a comparison between a charging current value applied to the interface and a first critical current value of the current reference control circuit, wherein the current reference control circuit is configured to gradually decrease the first critical current value based on a voltage value applied to the interface reaching a first critical voltage value, and maintain the first critical current value based on the voltage value applied to the interface being less than the first critical voltage value.

An electronic device according to an example embodiment of the disclosure may include: an interface including a conductive piece and a power adjustment circuit, wherein the power adjustment circuit is configured to gradually increase and output a charging current value for charging a battery of an external electronic device, while the electronic device and the external electronic device contact through the interface, based on a voltage value applied to the interface reaching a first critical voltage value according to output of the charging current, charge the battery while gradually decreasing the charging current value until the voltage value applied to the interface drops below the first critical voltage value, based on the voltage value applied to the interface again reaching the first critical voltage value while the battery is charged with the gradually reduced charging current value, additionally reduce the reduced charging current value, based on the additionally reduced charging value reaching a termination current value, stop output of the charging current, and based on the additionally reduced charging value exceeding the termination current value, the battery is charged with the additionally reduced charging current value.

A method for controlling an electronic device according to an example embodiment of the disclosure may include: based on a voltage value applied to an interface of the electronic device reaching a first critical voltage value, gradually decreasing the first critical current value by a current reference control circuit of the electronic device until the voltage value applied to the interface falls below the first critical voltage value, and maintaining the first critical current value by the current reference control circuit of the electronic device based on the voltage value applied to the interface being less than the first critical voltage value, wherein the electronic device includes a charging current control circuit configured to control a magnitude of a charging current applied to the interface, based on a control signal resulting from a comparison between a charging current value applied to the interface and the first critical current value of the current reference control circuit.

Various example embodiments of the disclosure may provide an electronic device capable of performing a battery charging function or operation in such a manner that charging loss is substantially reduced without adding a separate interface for battery cell sensing other than conventional interfaces (for example, V_BUS terminal and GNG terminal) provided in the electronic device (for example, charging cradle) (in other words, without having to acquire battery cell voltage information by the electronic device (for example, charging cradle)).

Various example embodiments of the disclosure may provide an electronic device capable of reducing charging loss, wherein the magnitude of charging current for charging the battery of an ear-wearable device is controlled with reference to whether or not an interface voltage (for example, POGO voltage) has reached a predesignated voltage (for example, first critical voltage), thereby reducing the difference between the charging voltage (VCHGO) and the battery cell voltage (VCELL).

It will be apparent to those skilled in the art that advantageous effects resulting from various embodiments are not limited to the above-described advantageous effects, and various advantageous effects are incorporated in the disclosure.

BRIEF DESCRIPTION OF THE DRAWINGS

The above and other aspects, features and advantages of certain embodiments of the present disclosure will be more apparent from the following detailed description, taken in conjunction with the accompanying drawings, in which.

DETAILED DESCRIPTION

Figure 1A:
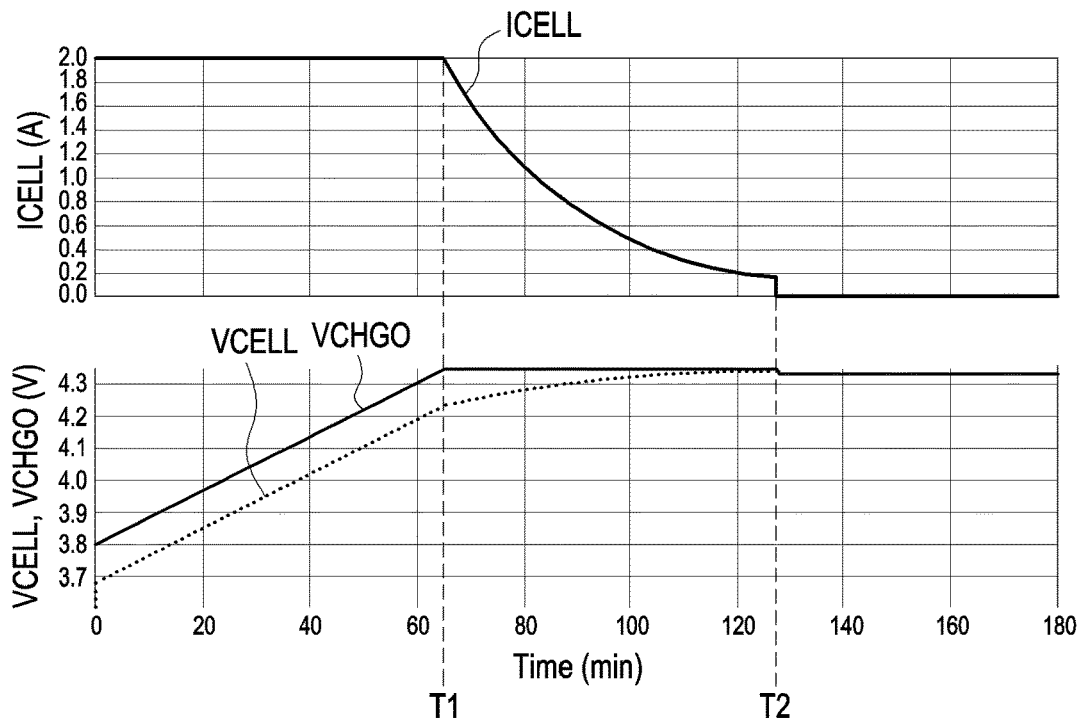
FIG. 1A is a diagram illustrating a function or an operation of performing constant current charging and constant voltage charging based on a voltage output by a charging circuit (e.g., a charger of a charging cradle)

Referring to FIG. 1A, a time interval before T1 illustrated in FIG. 1A may be a constant current charging interval, and a time interval from T1 to T2 may be a constant voltage charging interval. In the case in which constant current charging and constant voltage charging are performed based on a voltage that is output by a charging circuit (e.g., a charger of a charging cradle), when the output voltage (e.g., VCHGO) of the charging circuit is supplied to a battery, the output voltage of the charging circuit (e.g., the charger of the charging cradle) reaches a target voltage before a voltage (e.g., VCELL) of the battery reaches the target voltage, and thus a charging current (ICELL) is reduced. In the case of this charging method, a charging time may be long.

Figure 1B:
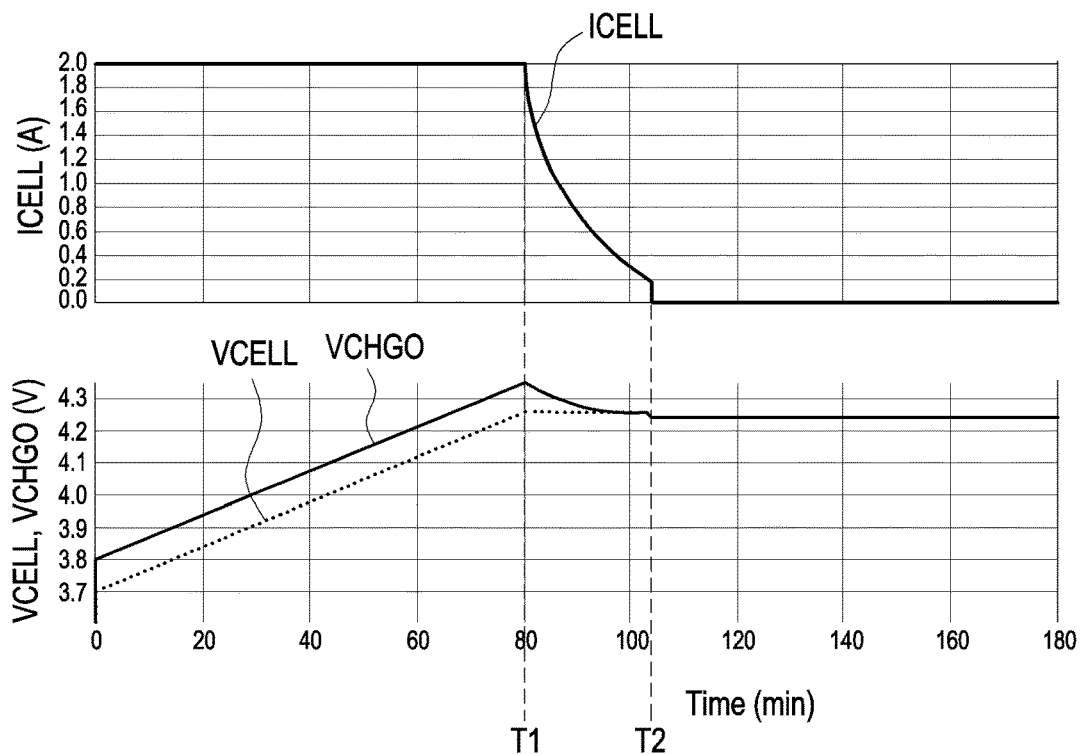
FIG. 1B is a diagram illustrating a function or an operation of performing cell sensing with addition of a separate interface other than a conventional interface and performing charging based on a voltage of a battery cell sensed by the cell sensing.

Referring to FIG. 1B, when a separate interface is allocated or power line communication is used, a mounting space may be increased due to additional elements such as a separate pin or power line communication IC for detecting the state of charging of a battery, and thus an electronic device (e.g., a charging cradle) is difficult to implement, or costs may be increased.

Figure 1C:
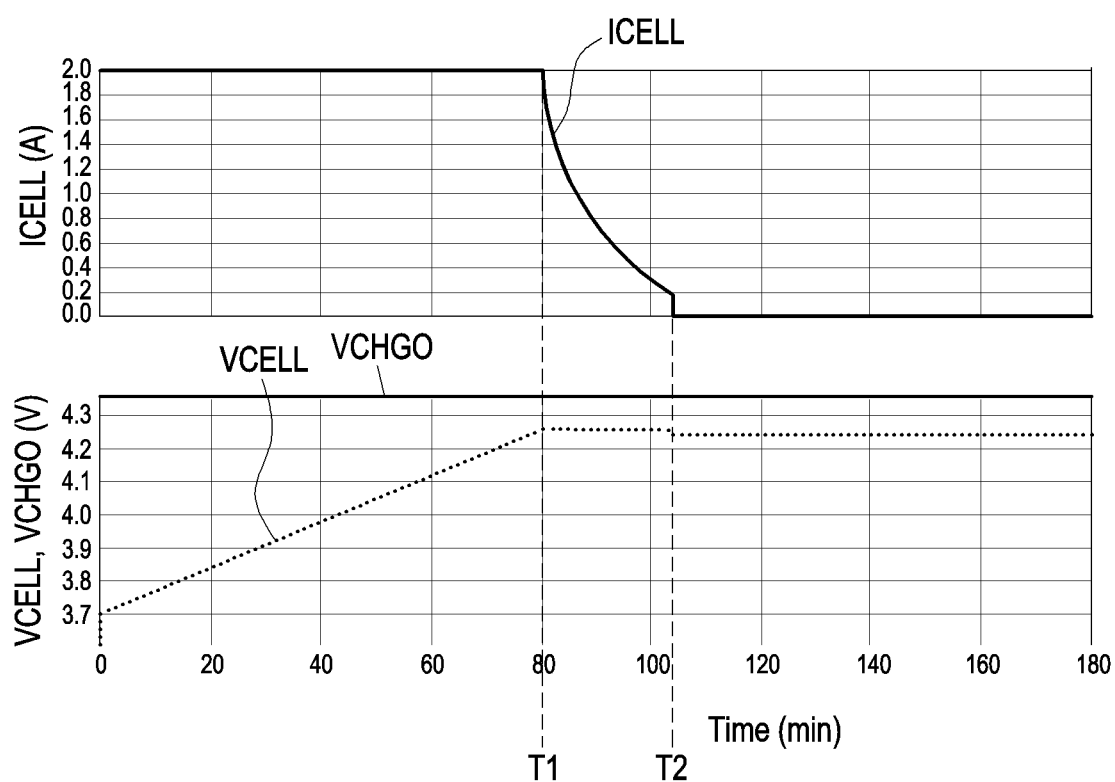
FIG. 1C is a diagram illustrating a function or an operation of applying a fixed voltage to an interface without adding a separate interface other than a conventional interface and directly performing cell sensing by a linear charger included in an external electronic device (in other words, an ear-wearable device) to charge a battery of the external electronic device.

Referring to FIG. 1C, when a fixed voltage is applied without allocating a separated interface and a linear charger included in an external electronic device senses a battery voltage/current and charges a battery of the external electronic device through a constant voltage/constant current function, the difference between an interface voltage and a battery voltage may be remain relatively large, and thus this voltage difference may result in charging loss.

Figure 2:
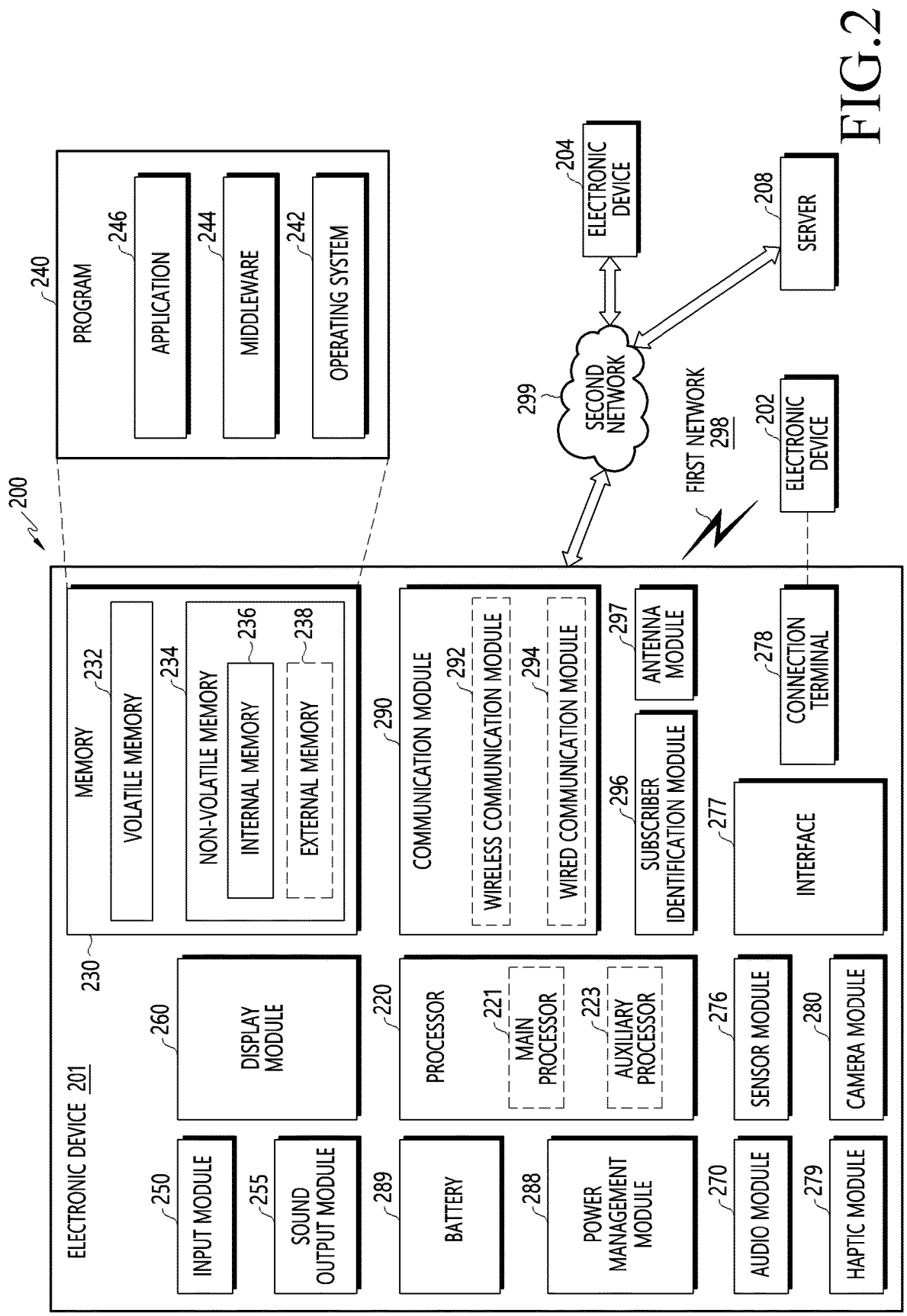
FIG. 2 is a block diagram illustrating an example configuration of an electronic device in a network environment according to various embodiments.

FIG. 2 is a block diagram illustrating an example electronic device 201 in a network environment 200 according to various embodiments. Referring to FIG. 2, the electronic device 201 in the network environment 200 may communicate with an electronic device 202 via a first network 298 (e.g., a short-range wireless communication network), or at least one of an electronic device 204 or a server 208 via a second network 299 (e.g., a long-range wireless communication network). According to an embodiment, the electronic device 201 may communicate with the electronic device 204 via the server 208. According to an embodiment, the electronic device 201 may include a processor 220, memory 230, an input module 250, a sound output module 255, a display module 260, an audio module 270, a sensor module 276, an interface 277, a connecting terminal 278, a haptic module 279, a camera module 280, a power management module 288, a battery 289, a communication module 290, a subscriber identification module (SIM) 296, or an antenna module 297. In various embodiments, at least one of the components (e.g., the connecting terminal 278) may be omitted from the electronic device 201, or one or more other components may be added in the electronic device 201. In various embodiments, some of the components (e.g., the sensor module 276, the camera module 280, or the antenna module 297) may be implemented as a single component (e.g., the display module 260).

The processor 220 may execute, for example, software (e.g., a program 240) to control at least one other component (e.g., a hardware or software component) of the electronic device 201 coupled with the processor 220, and may perform various data processing or computation. According to an embodiment, as at least part of the data processing or computation, the processor 220 may store a command or data received from another component (e.g., the sensor module 276 or the communication module 290) in volatile memory 232, process the command or the data stored in the volatile memory 232, and store resulting data in non-volatile memory 234. According to an embodiment, the processor 220 may include a main processor 221 (e.g., a central processing unit (CPU) or an application processor (AP)), or an auxiliary processor 223 (e.g., a graphics processing unit (GPU), a neural processing unit (NPU), an image signal processor (ISP), a sensor hub processor, or a communication processor (CP)) that is operable independently from, or in conjunction with, the main processor 221. For example, when the electronic device 201 includes the main processor 221 and the auxiliary processor 223, the auxiliary processor 223 may be adapted to consume less power than the main processor 221, or to be specific to a specified function. The auxiliary processor 223 may be implemented as separate from, or as part of the main processor 221.

The auxiliary processor 223 may control, for example, at least some of functions or states related to at least one component (e.g., the display module 260, the sensor module 276, or the communication module 290) among the components of the electronic device 201, instead of the main processor 221 while the main processor 221 is in an inactive (e.g., sleep) state, or together with the main processor 221 while the main processor 221 is in an active (e.g., executing an application) state. According to an embodiment, the auxiliary processor 223 (e.g., an image signal processor or a communication processor) may be implemented as part of another component (e.g., the camera module 280 or the communication module 290) functionally related to the auxiliary processor 223. According to an embodiment, the auxiliary processor 223 (e.g., the neural processing unit) may include a hardware structure specified for artificial intelligence model processing. An artificial intelligence model may be generated by machine learning. Such learning may be performed, e.g., by the electronic device 201 where the artificial intelligence model is performed or via a separate server (e.g., the server 208). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 230 may store various data used by at least one component (e.g., the processor 220 or the sensor module 276) of the electronic device 201. The various data may include, for example, software (e.g., the program 240) and input data or output data for a command related thereto. The memory 230 may include the volatile memory 232 or the non-volatile memory 234.

The program 240 may be stored in the memory 230 as software, and may include, for example, an operating system (OS) 242, middleware 244, or an application 246.

The input module 250 may receive a command or data to be used by another component (e.g., the processor 220) of the electronic device 201, from the outside (e.g., a user) of the electronic device 201. The input module 250 may include, for example, a microphone, a mouse, a keyboard, a key (e.g., a button), or a digital pen (e.g., a stylus pen).

The sound output module 255 may output sound signals to the outside of the electronic device 201. The sound output module 255 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 260 may visually provide information to the outside (e.g., a user) of the electronic device 201. The display module 260 may include, for example, a display, a hologram device, or a projector and control circuitry to control a corresponding one of the display, hologram device, and projector. According to an embodiment, the display module 260 may include a touch sensor adapted to detect a touch, or a pressure sensor adapted to measure the intensity of force incurred by the touch.

The audio module 270 may convert a sound into an electrical signal and vice versa. According to an embodiment, the audio module 270 may obtain the sound via the input module 250, or output the sound via the sound output module 255 or an external electronic device (e.g., an electronic device 202 (e.g., a speaker or a headphone)) directly or wirelessly coupled with the electronic device 201.

The sensor module 276 may detect an operational state (e.g., power or temperature) of the electronic device 201 or an environmental state (e.g., a state of a user) external to the electronic device 201, and then generate an electrical signal or data value corresponding to the detected state. According to an embodiment, the sensor module 276 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 277 may support one or more specified protocols to be used for the electronic device 201 to be coupled with the external electronic device (e.g., the electronic device 202) directly or wirelessly. According to an embodiment, the interface 277 may include, for example, a high definition multimedia interface (HDMI), a universal serial bus (USB) interface, a secure digital (SD) card interface, or an audio interface.

A connecting terminal 278 may include a connector via which the electronic device 201 may be physically connected with the external electronic device (e.g., the electronic device 202). According to an embodiment, the connecting terminal 278 may include, for example, an HDMI connector, a USB connector, an SD card connector, or an audio connector (e.g., a headphone connector).

The haptic module 279 may convert an electrical signal into a mechanical stimulus (e.g., a vibration or a movement) or electrical stimulus which may be recognized by a user via his tactile sensation or kinesthetic sensation. According to an embodiment, the haptic module 279 may include, for example, a motor, a piezoelectric element, or an electric stimulator.

The camera module 280 may capture a still image or moving images. According to an embodiment, the camera module 280 may include one or more lenses, image sensors, image signal processors, or flashes.

The power management module 288 may manage power supplied to the electronic device 201. According to an embodiment, the power management module 288 may be implemented as at least part of, for example, a power management integrated circuit (PMIC).

The battery 289 may supply power to at least one component of the electronic device 201. According to an embodiment, the battery 289 may include, for example, a primary cell which is not rechargeable, a secondary cell which is rechargeable, or a fuel cell.

The communication module 290 may support establishing a direct (e.g., wired) communication channel or a wireless communication channel between the electronic device 201 and the external electronic device (e.g., the electronic device 202, the electronic device 204, or the server 208) and performing communication via the established communication channel. The communication module 290 may include one or more communication processors that are operable independently from the processor 220 (e.g., the application processor (AP)) and supports a direct (e.g., wired) communication or a wireless communication. According to an embodiment, the communication module 290 may include a wireless communication module 292 (e.g., a cellular communication module, a short-range wireless communication module, or a global navigation satellite system (GNSS) communication module) or a wired communication module 294 (e.g., a local area network (LAN) communication module or a power line communication (PLC) module). A corresponding one of these communication modules may communicate with the external electronic device 204 via the first network 298 (e.g., a short-range communication network, such as Bluetooth™, wireless-fidelity (Wi-Fi) direct, or infrared data association (IrDA)) or the second network 299 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 292 may identify or authenticate the electronic device 201 in a communication network, such as the first network 298 or the second network 299, using subscriber information (e.g., international mobile subscriber identity (IMSI)) stored in the subscriber identification module 296.

The wireless communication module 292 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 292 may support a high-frequency band (e.g., the mmWave band) to achieve, e.g., a high data transmission rate. The wireless communication module 292 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 292 may support various requirements specified in the electronic device 201, an external electronic device (e.g., the electronic device 204), or a network system (e.g., the second network 299). According to an embodiment, the wireless communication module 292 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 297 may transmit or receive a signal or power to or from the outside (e.g., the external electronic device) of the electronic device 201. According to an embodiment, the antenna module 297 may include an antenna including a radiating element including a conductive material or a conductive pattern formed in or on a substrate (e.g., a printed circuit board (PCB)). According to an embodiment, the antenna module 297 may include a plurality of antennas (e.g., array antennas). In such a case, at least one antenna appropriate for a communication scheme used in the communication network, such as the first network 298 or the second network 299, may be selected, for example, by the communication module 290 from the plurality of antennas. The signal or the power may then be transmitted or received between the communication module 290 and the external electronic device via the selected at least one antenna. According to an embodiment, another component (e.g., a radio frequency integrated circuit (RFIC)) other than the radiating element may be additionally formed as part of the antenna module 297.

According to various embodiments, the antenna module 297 may form a mmWave antenna module. According to an embodiment, the mmWave antenna module may include a printed circuit board, an RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 201 and the external electronic device 204 via the server 208 coupled with the second network 299. Each of the external electronic devices 202 or 204 may be a device of a same type as, or a different type, from the electronic device 201. According to an embodiment, all or some of operations to be executed at the electronic device 201 may be executed at one or more of the external electronic devices 202, 204, or 208. For example, if the electronic device 201 should perform a function or a service automatically, or in response to a request from a user or another device, the electronic device 201, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 201. The electronic device 201 may provide the outcome, with or without further processing of the outcome, as at least part of a reply to the request. To that end, a cloud computing, distributed computing, mobile edge computing (MEC), or client-server computing technology may be used, for example. The electronic device 201 may provide ultra low-latency services using, e.g., distributed computing or mobile edge computing. In an embodiment, the external electronic device 204 may include an internet-of-things (IoT) device. The server 208 may be an intelligent server using machine learning and/or a neural network. According to an embodiment, the external electronic device 204 or the server 208 may be included in the second network 299. The electronic device 201 may be applied to intelligent services (e.g., smart home, smart city, smart car, or healthcare) based on 5G communication technology or IoT-related technology.

Figure 3A:
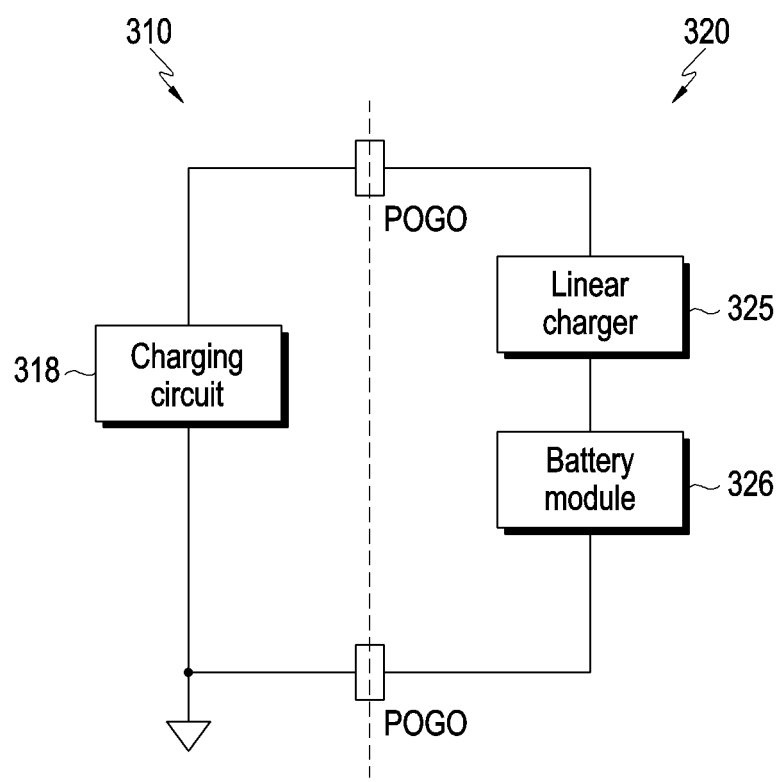
FIG. 3A is a diagram illustrating an example charging system for charging a battery according to various embodiments.

FIG. 3A is a diagram illustrating an example configuration of a charging system for charging a battery (e.g., a battery module 326) according to various embodiments.

Figure 4:
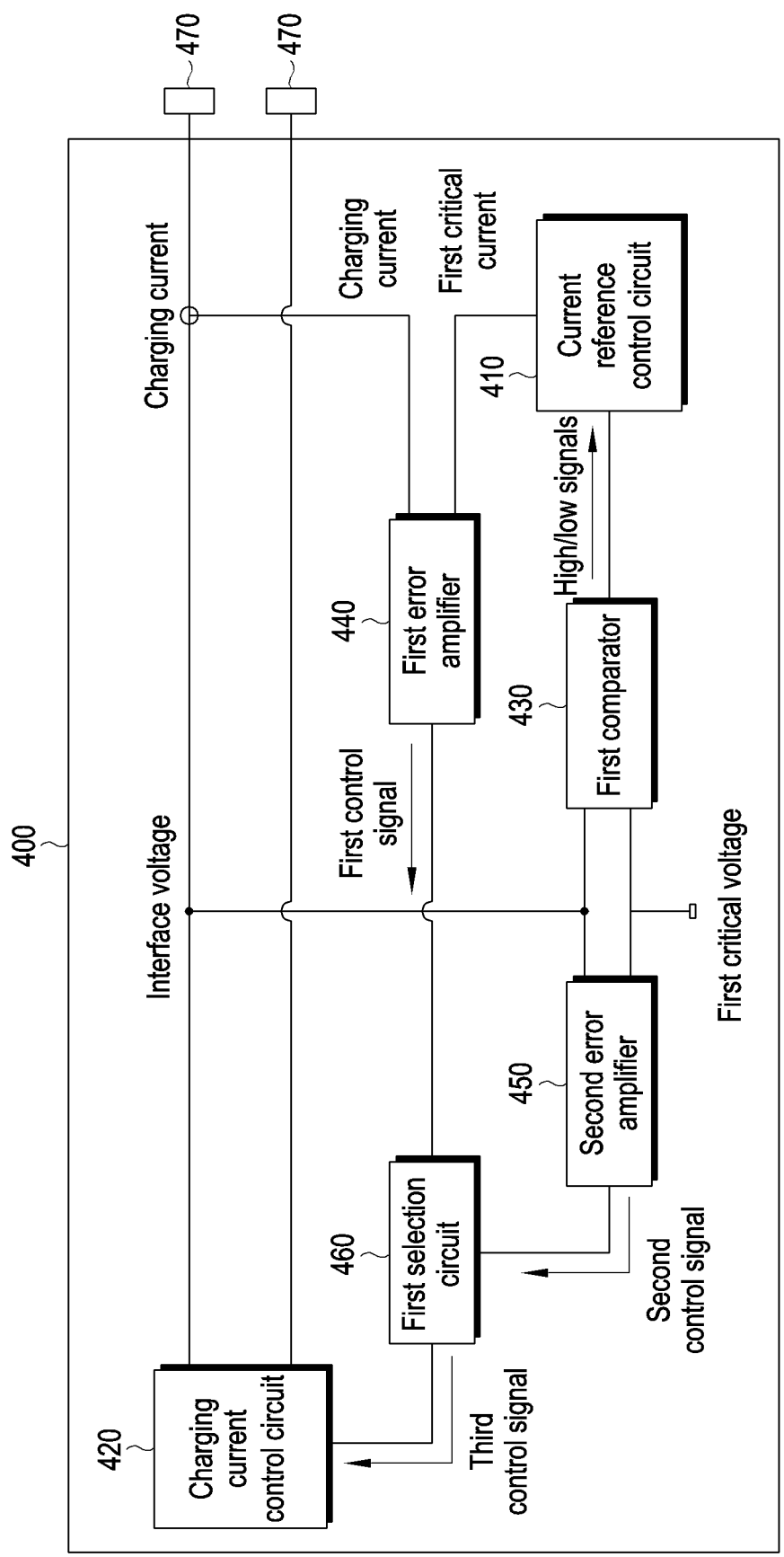
FIG. 4 is a block diagram illustrating an example configuration of a first charger included in a charging device according to various embodiments.

Referring to FIG. 3A, a charging device 310 according to an embodiment may include a charging circuit 318 (e.g., a first charger 400 referring to FIG. 4). The charging circuit according to an embodiment may be electrically connected to an external electronic device (e.g., an ear-wearable device 320) through a pogo pin. The external electronic device (e.g., the ear-wearable device 320) according to an embodiment may include a linear charger 325 (e.g., a second charger 500 referring to FIG. 5) and a battery module (e.g., including a battery) 326. The charging circuit 318 according to an embodiment may output a charging current for charging the battery module 326 to the linear charger 325. The linear charger 325 according to an embodiment may compare a current supplied to the battery module 326 (hereinafter, a battery current value) and a battery voltage value with a second critical current value and a second critical voltage value, respectively, and may adjust (e.g., increase), based on the result of the comparison a resistance value of a MOSFET 510 (refer to FIG. 5) included in the linear charger 325. The charging circuit 318 according to an embodiment may adjust and output the magnitude of a charging current based on a voltage applied to the pogo pine, changed depending on the adjustment of the resistance value of the MOSFET 510. The above-described function or operation of the disclosure will be described in greater detail below with reference to FIGS. 4 and 5.

Figure 3B:
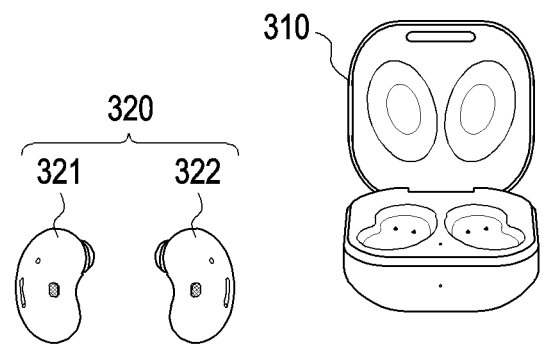
FIGS. 3B and 3C are diagrams illustrating an example charging device and an ear-wearable device according to various embodiments.
Figure 3C:
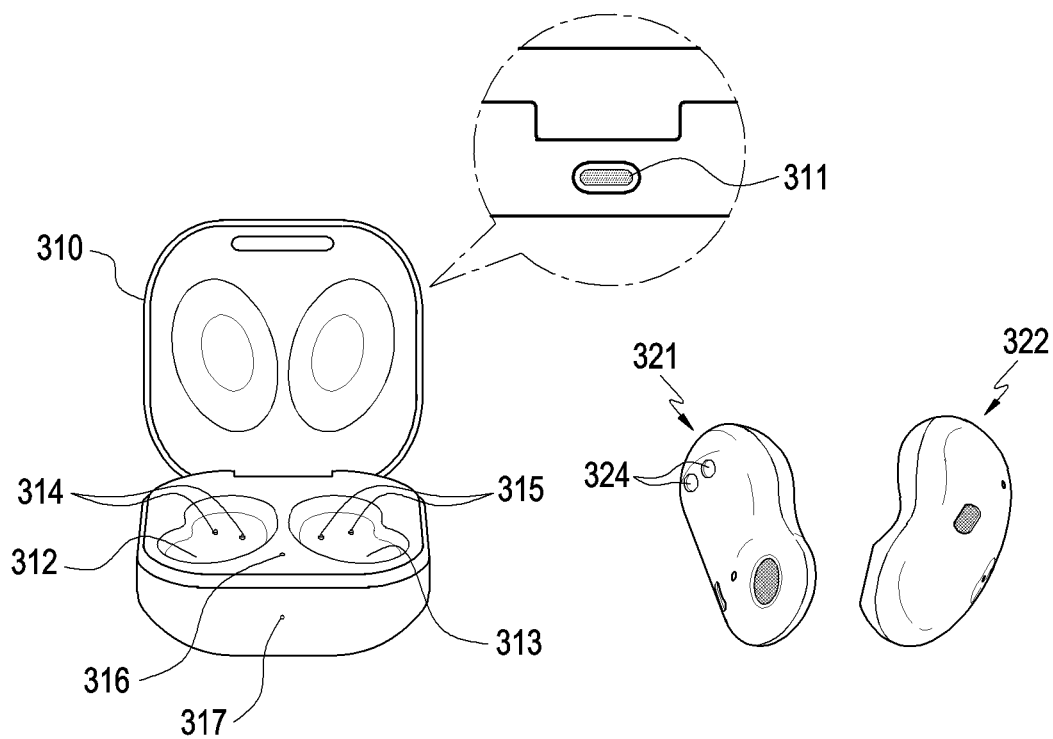

FIGS. 3B and 3C are diagrams illustrating an example charging device 310 and an example ear-wearable device 320 according to various embodiments. According to an embodiment, the ear-wearable device 320 may also be referred to as an earphone, an ear piece, an ear bud, or a hearing device, or the like. Further, the charging device 310 according to an embodiment may be referred to as a charging cradle or a charging case, or the like.

According to an embodiment, the ear-wearable device 320 (e.g., the electronic device 201 in FIG. 2) may include a housing (or a body). For example, the housing may include a portion to be detachably mounted on a user's ear, a speaker, a battery, a wireless communication circuit, a memory, or a processor.

According to an embodiment, when being seated on the charging device 310, the ear-wearable device 320 may perform a charging operation based on a voltage supplied from the charging device 310. According to an embodiment, the ear-wearable device 320 may receive, through an electrical circuit, power transmitted from the charging device 310, and may charge a battery based on the applied power. The ear-wearable device 320 may be driven by a rechargeable/dischargeable battery.

According to an embodiment, the charging device 310 may include a housing (or a body), and, for example, the housing may include at least one fastening groove (e.g., a fixing member) configured to receive a communication circuit, a power interface, a control circuit, a battery, and the ear-wearable device 320 which includes a pair of devices, including a first ear-wearable device 321 and a second ear-wearable device 322 that can be worn on both ears of the user, respectively. According to an embodiment, the charging device 310 may include a battery therein to charge the ear-wearable device 320 without being connected to a separate power supply device (not shown).

According to an embodiment, the charging device 310 may be connected to a power supply device to charge the ear-wearable device 320 regardless of whether a battery is included therein. To this end, the charging device 310 may include the charging circuit 318 for charging the ear-wearable device 320.

According to an embodiment, the charging device 310 may process, based on state information of the ear-wearable device 320, an operation of charging the ear-wearable device 320. For example, the charging device 310 may also charge the ear-wearable device 320 by charging-level detection using the charging circuit 318.

Referring to FIG. 3C, the charging device 310 may include a first mounting part 312 and a second mounting part 313, which are configured to receive the pair of ear-wearable devices 321 and 322. For example, the first mounting part 312 may have the shape of a groove in which a first ear-wearable device 321 is partially fitted, and likewise, the second mounting part 313 may have the shape of a groove in which the second ear-wearable device 322 is partially fitted. According to an embodiment, the first mounting part 312 may include at least one charging contact 314. According to an embodiment, as illustrated in FIG. 3, the at least one charging contact 314 in the first mounting part 312 may include two-pin-type pogo pin, and may include, for example, a VBUS terminal and a GND terminal.

For example, when the first ear-wearable device 321 is mounted on the first mounting part 312, at least one contact 324 of the first ear-wearable device 321 may be electrically connected to the at least one charging contact 314 of the first mounting part 312. Likewise, the second mounting part 313 may include at least one charging contact 315, and the at least one charging contact 315 may be electrically connected to at least one contact of the second ear-wearable device 322.

According to an embodiment, the first ear-wearable device 321 and the second ear-wearable device 322 may use connection terminals (pads) formed in the respective housing to be provided with charging power through an electrical connection using at least one contact 314 or 315 of the charging device 310. For example, as in the perspective view of FIG. 3B illustrating the shape of the first ear-wearable device 321 seen in a first direction, the first ear-wearable device 321 may include multiple electrodes, and the multiple electrodes, which are connection terminals for being provided with charging power, may be exposed to the outer surface of the housing. Further, although FIG. 3B illustrates the shape of the second ear-wearable device 322 seen in another direction, the second ear-wearable device 322 may include the same multiple electrodes as the first ear-wearable device 321 at an opposite side to the outer surface of the housing.

According to an embodiment, the charging device 310 may include an outer interface (e.g., a connector) 311. For example, the outer interface may be a USB-type connector or charging port. According to an embodiment, the charging device 310 may receive power from an external device (e.g., a power source) through the outer interface 311.

According to an embodiment, the charging device 310 may include a battery (not shown). For example, the charging device 310 may receive power from the external device to charge the battery. Further, when the first ear-wearable device 321 and the second ear-wearable device 322 are mounted on the first mounting part 312 and the second mounting part 313, respectively, a battery of each of the first ear-wearable device 321 and the second ear-wearable device 322 may be charged by the battery of the charging device 310.

According to an embodiment, the charging device 310 may include an indicator light 317 for indicating the battery level of the charging device (or charging case), and may include an indicator light 316 for indicating the battery level of the ear-wearable devices 321 and 322.

FIG. 4 is a block diagram illustrating an example configuration of a first charger 400 included in the charging device 310 according to various embodiments. Referring to FIG. 4, the charging device 310 according to an embodiment may include the first charger 400. The first charger 400 according to an embodiment may include at least one among a current reference control circuit 410, a charging current control circuit 420, a first comparator 430, a first error amplifier 440, a second error amplifier 450, and a first selection circuit 460. The charging device 310 according to an embodiment may also include a control signal generator which includes the current reference control circuit 410, the first comparator 430, the first error amplifier 440, the second error amplifier 450, and the first selection circuit 460.

The current reference control circuit 410 according to an embodiment may determine a first critical current value based on a signal (e.g., high/low signal) received from the first comparator 430. For example, when a high signal is received from the first comparator 430, the current reference control circuit 410 according to an embodiment may decrease the first critical current value by a predesignated value (e.g., 50 mA). When a low signal is received from the first comparator 430, the current reference control circuit 410 according to an embodiment may maintain a currently configured first critical current value. The current reference control circuit 410 according to an embodiment may output (or transmit) information about the first critical current value to the first error amplifier 440.

The charging current control circuit 420 according to an embodiment may control the magnitude of charging current, which is input to the first charger 400 from the outside, based on a third control signal received from the first selection circuit 460. The charging current control circuit 420 according to an embodiment may also include a current supply circuit. In this case, the charging current control circuit 420 according to an embodiment may be configured to output a charging current. The charging current control circuit 420 according to an embodiment may control a duty cycle (or a pulse width) to control the magnitude of a charging current. The third control signal according to an embodiment may include a control signal that is output from an error amplifier having a smaller error value among an amplified error (or difference) value included in a first control signal output from the first error amplifier 440 and an amplified error value included in a second control signal output from the second error amplifier 450. The first control signal, the second control signal, and the third control signal according to an embodiment may be analog signals. The charging current control circuit 420 according to an embodiment may adjust, for example, the magnitude of a charging current based on a mapping table in which a correlation between an amplified error value and the magnitude of an output current is defined. When the third control signal is received, the charging current control circuit 420 according to an embodiment may adjust the pulse width of a charging current such that the charging current decreased by the predetermined value (e.g., 50 mA) is applied to an interface 470. According to an embodiment, information about a value of the charging current having an adjusted (e.g., decreased) magnitude, may be sensed by the first error amplifier 440. The first error amplifier 440 according to an embodiment may compare the first critical current value and the value of the charging current having an adjusted magnitude. The first error amplifier 440 according to an embodiment may calculate an error (in other words, a difference) between the magnitude of the charging current and the first critical current value, may amplify the same according to a gain of the first error amplifier 440, and may output the same as a first signal to the first selection circuit 460.

The first comparator 430 according to an embodiment may be configured to compare a voltage value applied to the interface 470 and a predetermined first critical voltage value (e.g., a voltage value (e.g., 4.7V) increased by a predesignated value rather than a full-charge voltage (e.g., 4.35V) of the battery module 326 of the ear-wearable device 320). Alternatively, according to an embodiment, the first comparator 430 may be configured to compare the voltage value applied to the interface 470 and a voltage value that is obtained by subtracting a predesignated offset voltage value (e.g., 0.1V) from the predetermined first critical voltage value (e.g., 4.7V).

When a voltage value currently applied to the interface reaches the first critical voltage value (or a voltage value obtained by subtracting the predesignated offset voltage value (e.g., 0.1V) from the first critical voltage value (e.g., 4.7V)), the first comparator 430 according to an embodiment may output a high signal (e.g., a (+) signal) to the current reference control circuit 410. When a voltage value currently applied to the interface does not reach the first critical voltage value (or a voltage value obtained by subtracting the predesignated offset voltage value (e.g., 0.1V) from the first critical voltage value (e.g., 4.7V)), the first comparator 430 according to an embodiment may output a low signal (e.g., a (−) signal) to the current reference control circuit 410.

The first error amplifier 440 according to an embodiment may compare an error between the magnitude of a charging current applied to the interface 470 and the first critical current, and may amplify the error according to a designated ratio (e.g., a gain of the first error amplifier 440). The first error amplifier 440 according to an embodiment may output, as the first control signal, a signal including information about the amplified error to the first selection circuit 460. For example, according to an embodiment, when the error has been amplified, a saturated value may be output as the first control signal based on the gain of the first error amplifier 440.

The second error amplifier 450 according to an embodiment may compare an error between the magnitude of the voltage value applied to the interface 470 and the first critical voltage value (e.g., 4.7V), and may amplify the error according to a designated ratio (e.g., a gain of the second error amplifier 450). The second error amplifier 450 according to an embodiment may output, as a second control signal, a signal including information about the amplified error to the first selection circuit 460. According to an embodiment, when the error has been amplified (e.g., when a voltage applied to the interface 470 is 4.0V and the first critical voltage is 4.7V), a saturated value may be output as the second control signal based on the gain of the second error amplifier 450.

The first selection circuit 460 according to an embodiment may output the third control signal to the charging current control circuit 420. The third control signal according to an embodiment may include a control signal that is output from an error amplifier having a smaller error value among an amplified error (or difference) value included in the first control signal output from the first error amplifier 440 and an amplified error value included in the second control signal output from the second error amplifier 450. For example, when the second control signal output by the second error amplifier 450 includes, as an amplified error value, a high-level saturated value among the high-level (e.g., (+)) saturated value and a low-level (e.g., (−)) saturated value for the second error amplifier 450 (e.g., when the voltage applied to the interface 470 is 4.0V, the first critical voltage value is 4.7V, and the gain of the second error amplifier 450 is 50,000), while the first control signal output by the first error amplifier 440 includes, as an amplified error value, a value between a high-level saturated value and a low-level saturated value for the first error amplifier 440 because the charging current and the first critical current maintain almost identical values by control (e.g., when the magnitude of a charging current applied to the interface 470 is 1.999 A, the first critical current value is 2.00 A, and the gain of the first error amplifier 440 is 3,000, in which case the output of the first error amplifier 440 may be 3V), the first control signal output by the first error amplifier 440 may be selected as the third control signal, and the third control signal may be output to the charging current control circuit 420.

Figure 5:
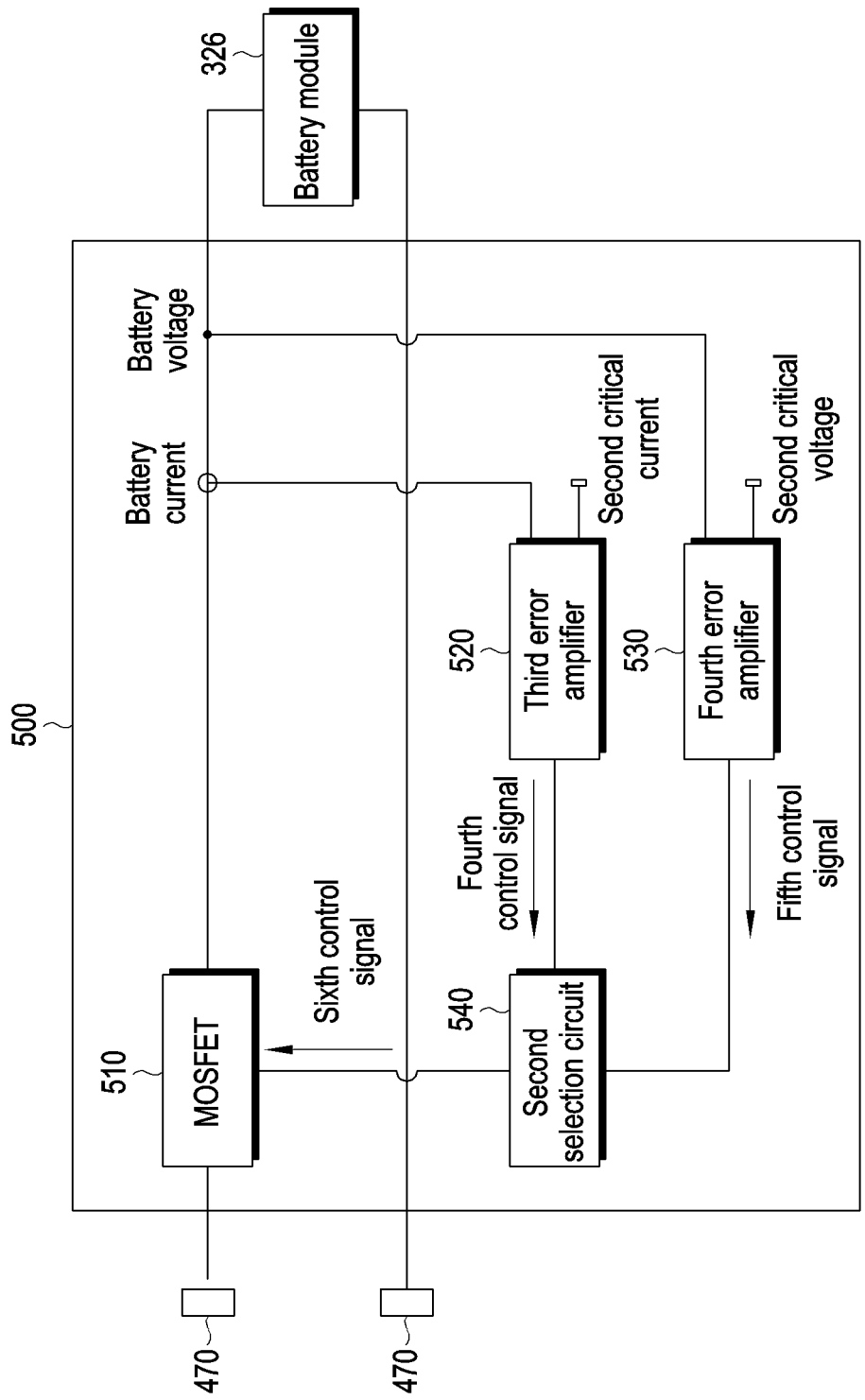
FIG. 5 is a block diagram illustrating an example configuration of a second charger included in an ear-wearable device according to various embodiments.

FIG. 5 is a block diagram illustrating an example configuration of a second charger 500 included in the ear-wearable device 320 according to various embodiments. Referring to FIG. 5, the second charger 500 according to an embodiment may include a MOSFET 510, a third error amplifier 520, a fourth error amplifier 530, and a second selection circuit 540. The second charger 500 according to an embodiment may be electrically connected to the battery module 326.

The MOSFET 510 according to an embodiment may be electrically connected to the interface 470. The MOSFET 510 according to an embodiment may function as a resistor. According to an embodiment, when a resistance value of the MOSFET 510 increases, the voltage value applied to the interface 470 may increase. In relation to the MOSFET 510 according to an embodiment, the resistance value of the MOSFET 510 may be increased by adjusting a gate voltage (e.g. decreasing a gate voltage) based on a sixth control signal output from the second selection circuit 540. The sixth control signal according to an embodiment may include a control signal that is output from an error amplifier having a smaller error value among an amplified error (or difference) value included in a fourth control signal output from the third error amplifier 520 and an amplified error value included in a fifth control signal output from the fourth error amplifier 530. The fourth control signal, the fifth control signal, and the sixth control signal according to an embodiment may be analog signals. The second selection circuit 540 according to an embodiment, for example, may adjust a resistance value of the MOSFET 510 based on a mapping table in which a correlation between an amplified error value and the magnitude of an output current is defined. Alternatively, after outputting the sixth control signal, the second selection circuit 540 according to an embodiment may adjust a gate voltage of the MOSFET 510 so as to have a resistance value increased by a predesignated value. When a current value of the battery module 326 is less than the second critical current value and when a voltage value of the battery is smaller than the second critical voltage value, the MOSFET 510 according to an embodiment may be fully turned on (e.g., when the resistance value of the MOSFET 510 is equal to or less than a specific value). According to an embodiment, even when the resistance of the MOSFET 510 is infinite, a voltage value applied to the interface 470 may not exceed the first critical voltage value.

The third error amplifier 520 according to an embodiment may compare an error between the magnitude of a battery current and the second critical current value, and may amplify the error according to a designated ratio (e.g., a gain of the third error amplifier 520). The third error amplifier 520 according to an embodiment may output, as the fourth control signal, a signal including information about the amplified error to the second selection circuit 540. For example, according to an embodiment, when the error has been amplified, a value saturated at a high-level (e.g., (+)) or low-level (e.g., (−)) may be output as the fourth control signal based on the gain of the third error amplifier 520.

The fourth error amplifier 530 according to an embodiment may compare an error between the magnitude of a battery voltage and the second critical voltage value (e.g., a full-charge voltage of a battery, 4.35V), and may amplify the error according to a designated ratio (e.g., a gain of the fourth error amplifier 530). The fourth error amplifier 530 according to an embodiment may output, as the fifth control signal, a signal including information about the amplified error to the second selection circuit 540. According to an embodiment, when the error has been amplified, a value saturated at a high-level (e.g., (+)) or low-level (e.g., (−)) may be output as the fifth control signal based on the gain of the fourth error amplifier 530.

The second selection circuit 540 according to an embodiment may output the sixth control signal to the MOSFET 510. The sixth control signal according to an embodiment may include a control signal that is output from an error amplifier having a smaller error value among the amplified error (or difference) value included in the fourth control signal output from the third error amplifier 520 and the amplified error value included in the fifth control signal output from the fourth error amplifier 530. For example, the fourth control signal output by the third error amplifier 520 may include, as an amplified error value, the high-level saturated value among the high-level saturated value and the low-level saturated value for the third error amplifier 520. Further, when the fifth control signal output by the fourth error amplifier 530 includes, as an amplified error value, the low-level saturated value among the high-level saturated value and the low-level saturated value for the fourth error amplifier 530, the fifth control signal output by the fourth error amplifier 530 may be selected as the sixth control signal, and the sixth control signal may be output to the MOSFET 510. The resistance value of the MOSFET 510 according to an embodiment may be adjusted by the sixth control signal. For example, the second selection circuit 540 according to an embodiment may adjust (e.g., increase) the resistance value of the MOSFET 510 using a mapping table in which a correlation between the amplified error value and the resistance value (or gate voltage value) of the MOSFET 510 is defined. Alternatively, the gate voltage of the MOSFET 510 according to an embodiment may also be controlled by the second selection circuit 540 so as to be adjusted based on a predesignated value. In the second selection circuit 540 according to an embodiment, when all of the fourth control signal and the fifth control signal have high-level saturated values, the sixth control signal may have the high-level saturated value included in the fourth control signal or the fifth control signal, in which case the magnitude of resistance of the MOSFET 510 may be maintained (in other words, the MOSFET may remain in a fully turned-on state).

Figure 6:
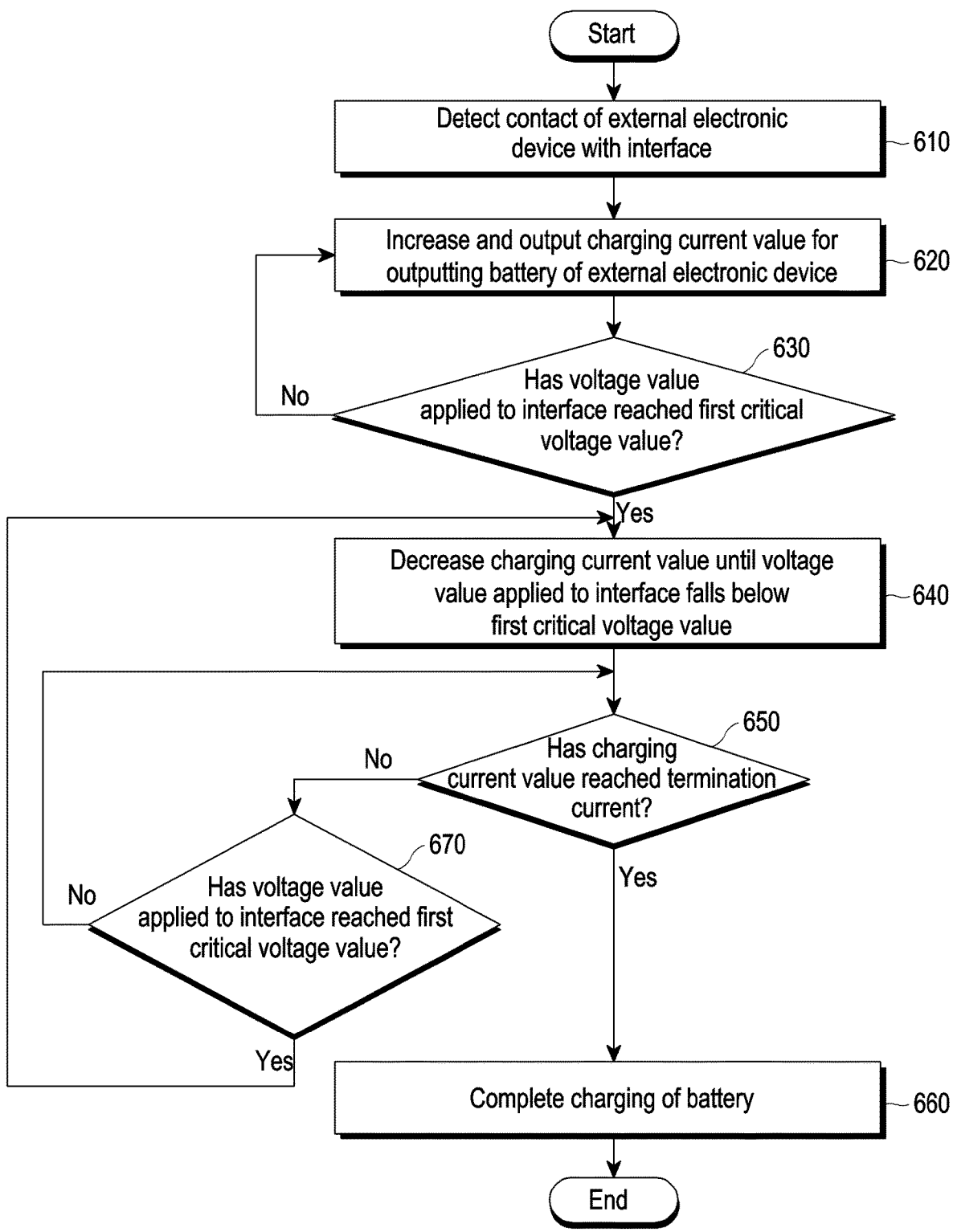
FIG. 6 is diagram flowchart illustrating an example operation of stopping charging of an external electronic device (e.g., an ear-wearable device) when a charging current value output from a charging device reaches a termination current value according to various embodiments.
Figure 7:
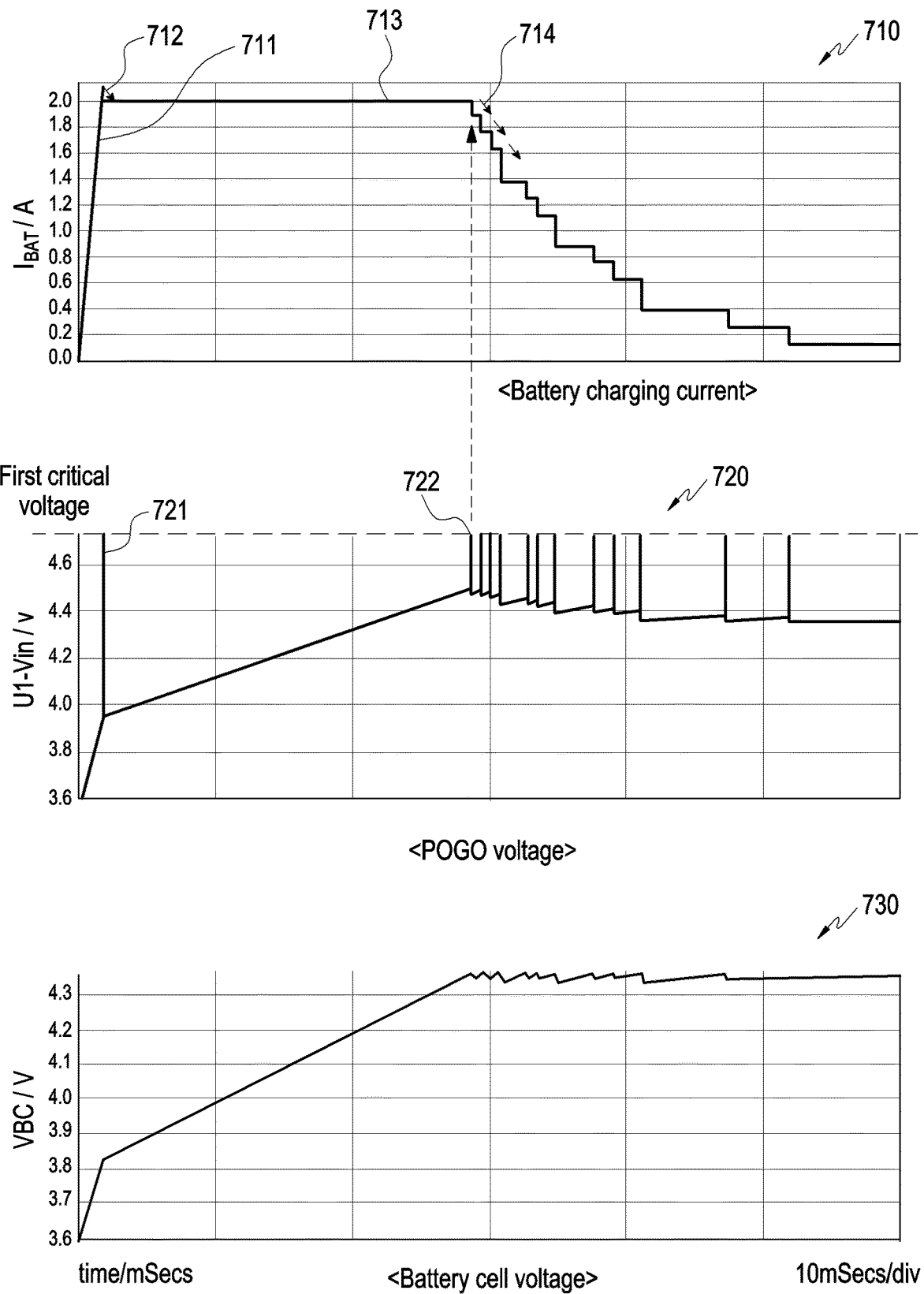
FIG. 7 includes graphs illustrating an example operation of charging a battery according to the operation illustrated in FIG. 6 according to various embodiments.

FIG. 6 is diagram flowchart illustrating an example operation of stopping (in other words, completing) charging of an external electronic device (e.g., the ear-wearable device 320) when a charging current value output from the charging device 310 reaches a termination current value according to various embodiments. FIG. 7 includes graphs illustrating an example operation of charging a battery according to the function or operation illustrated in FIG. 6 according to various embodiments. FIG. 7 illustrates a graph 710 regarding control of a charging current, a graph 720 regarding a change in an interface voltage, and a graph 730 regarding a change in a battery voltage.

Referring to FIG. 6, in operation 610, the charging device 310 according to an embodiment may detect contact of the external electronic device (e.g., the ear-wearable device 320) with the interface 470. In operation 620, the charging device 310 according to an embodiment may increase and output a value of a charging current for charging the battery module 326 of the external electronic device (e.g., the ear-wearable device 320). FIG. 7 illustrates a function or operation 711 of outputting a charging current while increasing the magnitude thereof.

In operation 630, the charging device 310 according to an embodiment may determine whether a voltage value applied to the interface 470 has reached a first critical voltage value. The charging device 310 (e.g., the first comparator 430) according to an embodiment may sense a voltage value currently applied to the interface 470, and may compare the sensed voltage value with the first critical voltage value. When the voltage value currently applied to the interface 470 reaches the first critical voltage value (630—Yes), the charging device 310 (e.g., the first comparator 430) according to an embodiment may output a high signal (e.g., a (+) signal) to the current reference control circuit 410. When the voltage value currently applied to the interface does not reach the first critical voltage value (630—No), the first comparator 430 according to an embodiment may output a low signal (e.g., a (−) signal) to the current reference control circuit 410. FIG. 7 illustrates the case 721 in which an interface voltage reaches the first critical voltage value (e.g., 4.7V) by an increase in a resistance value of the MOSFET 510.

When the voltage value applied to the interface 470 has reached the first critical voltage value (e.g., 4.7V) (operation 630—Yes), the charging device 310 according to an embodiment may decrease, in operation 640, the charging current value until the voltage value applied to the interface 470 falls below the first critical voltage value. When a high signal is received from the first comparator 430, the charging device 310 (e.g., the current reference control circuit 410) according to an embodiment may decrease the first critical current value by a predesignated value (e.g., 50 mA). The charging device 310 according to an embodiment may repeatedly perform operation 630 and operation 640 until the voltage value applied to the interface 470 falls below the first critical voltage value. Thus, the first critical current value may be gradually/continuously decreased. FIG. 7 illustrates a function or operation 712 by which a charging current is decreased based on the voltage applied to the interface 470 reaching a first critical voltage 721 and a function or operation 713 of charging the battery module 326 using a charging current (e.g., 2.00A) having the decreased magnitude.

In operation 650, the charging device 310 according to an embodiment may determine whether the decreased charging current value has reached a termination current. When the decreased charging current value has reached the termination current (650—Yes), the charging device 310 according to an embodiment may complete, in operation 660, charging of the battery module 326 (e.g., may continuously output the current reaching the termination current or may stop outputting of the charging current). For example, when the charging current value is less than a termination current value (e.g., 0.2 A), the current reference control circuit 410 may change the first critical current value to 0 to make an output charging current have a value of 0, thereby completing charging of the battery module 326. When the decreased charging current value has not reached the termination current (650—No), the charging device 310 according to an embodiment may determine, in operation 670, whether the voltage value applied to the interface 470 has reached the first critical voltage value again. FIG. 7 illustrates the case 722 in which the voltage value applied to the interface 470 has reached the first critical voltage value again. When the voltage value applied to the interface 470 has reached the first critical voltage value again (operation 670—Yes), the charging device 310 according to an embodiment may perform operation 640 again. FIG. 7 illustrates a function or operation 714 by which the charging current is decreased again when the voltage value applied to the interface 470 reaches the first critical voltage value again. When the voltage value applied to the interface 470 has not reached the first critical voltage value again (operation 670—No), the charging device 310 according to an embodiment may perform operation 650 again. The above-described method of charging of the battery module 326 can reduce the difference between an interface voltage and a battery cell voltage, and thus can have an advantageous effect of reducing charging loss.

Figure 8:
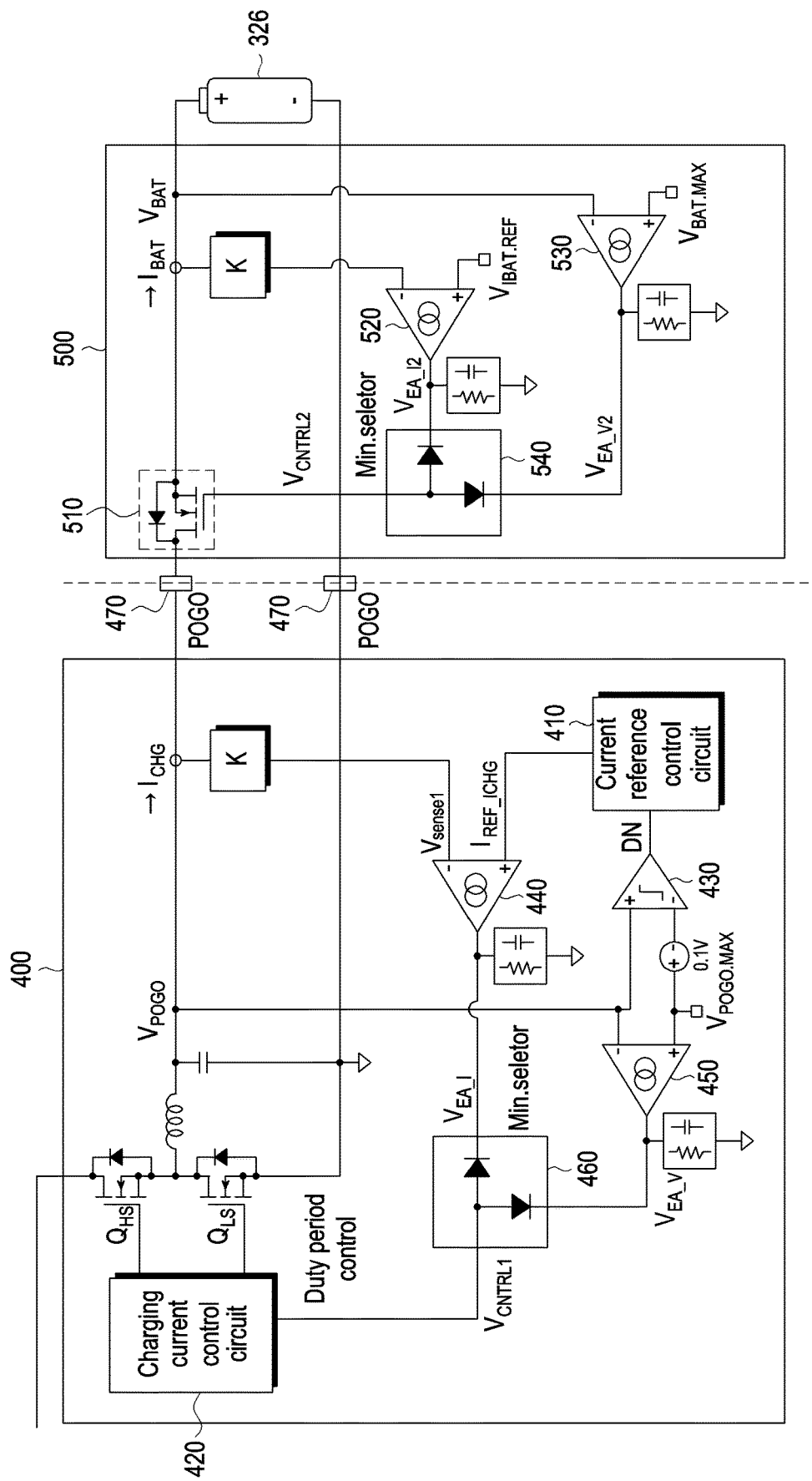
FIG. 8 is a circuit diagram illustrating an example configuration of a first charger and a second charger according to various embodiments.

FIG. 8 is a circuit diagram illustrating example configurations of a first charger 400 and a second charger 500 according to various embodiments. The second charger 500 according to an embodiment may further include a control circuit for controlling the MOSFET 510 although the control circuit is not illustrated.

Referring to FIG. 8, the charging device 310 according to an embodiment may include the first charger 400. The first charger 400 according to an embodiment may include at least one among a current reference control circuit 410, a charging current control circuit 420, a first comparator 430, a first error amplifier 440, a second error amplifier 450, and a first selection circuit 460. The current reference control circuit 410 according to an embodiment may be electrically connected to the first comparator 430. The first comparator 430 according to an embodiment may include at least one calculation amplifier. The first comparator 430 according to an embodiment may be electrically connected to the second error amplifier 450. Each of the first error amplifier 440 and the second error amplifier 450 according to an embodiment may include at least one calculation amplifier. A first critical current value may be input into one end of the first error amplifier 440 according to an embodiment, and a charging current value may be input into the other end thereof. The first critical voltage value may be input into one end of the second error amplifier 450 according to an embodiment, and a voltage value of an interface 470 may be input into the other end thereof. The first error amplifier 440 and the second error amplifier 450 according to an embodiment may be electrically connected to the first selection circuit 460. The first selection circuit 460 according to an embodiment may include at least two diodes.

The ear-wearable device 310 according to an embodiment may include the second charger 500. The second charger 500 herein may include at least one among at least one MOSFET 510, a third error amplifier 520, a fourth error amplifier 530, a second selection circuit 540, and a battery module 326. The at least one MOSFET 510 according to an embodiment may be electrically connected to the second selection circuit 540. Each of the third error amplifier 520 and the fourth error amplifier 530 according to an embodiment may include at least one calculation amplifier. The second selection circuit 540 according to an embodiment may include at least two diodes. A second critical current value may be input into one end of the third error amplifier 520 according to an embodiment, and a battery current value may be input into the other end thereof. A second critical voltage value may be input into one end of the fourth error amplifier 530 according to an embodiment, and a battery voltage value may be input into the other end thereof.

Figure 9:
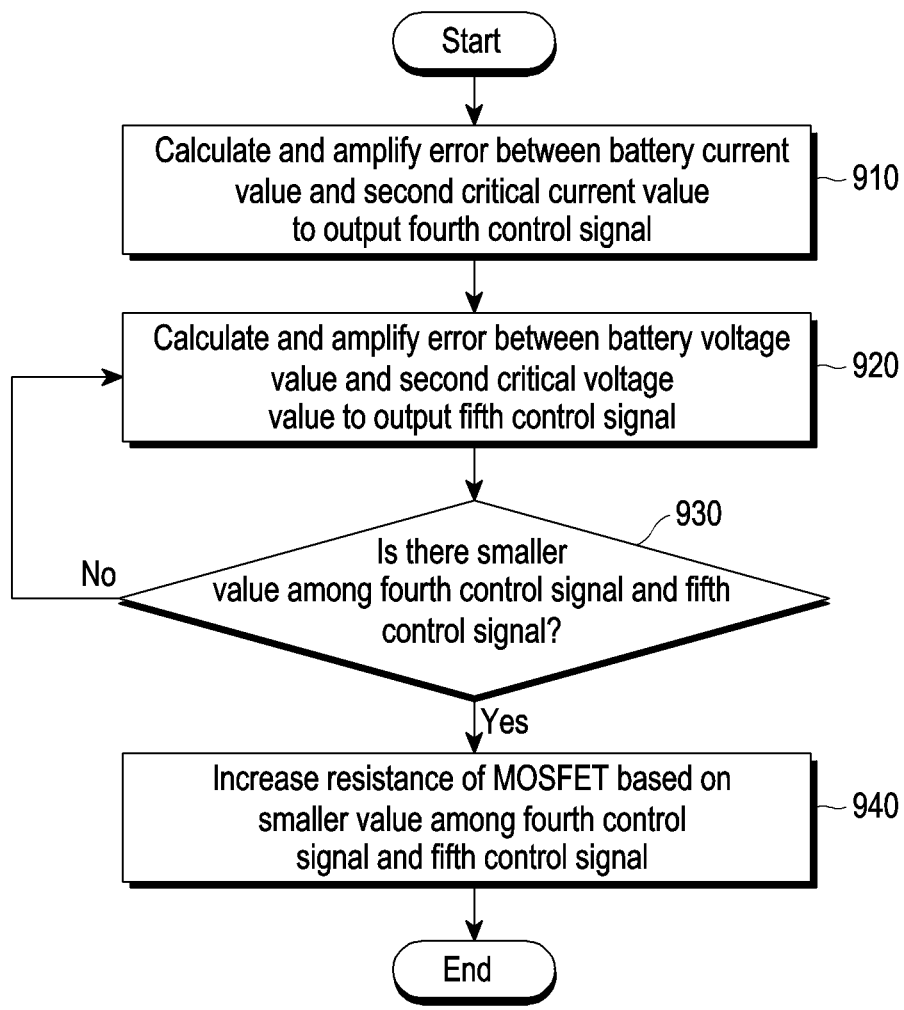
FIG. 9 is a flowchart illustrating an example operation of increasing resistance of a MOSFET included in a second charger according to various embodiments.

FIG. 9 is a flowchart illustrating an example operation of increasing resistance of the MOSFET 510 included in the second charger 500 according to various embodiments.

Referring to FIG. 9, in operation 910, the second charger 500 according to an embodiment (e.g., the third error amplifier 520) may calculate and amplify an error between the battery current value and the second critical current value to output a fourth control signal. In operation 920, the second charger 500 according to an embodiment (e.g., the fourth error amplifier 530) may calculate and amplify an error between the battery voltage value and the second critical voltage value to output a fifth control signal. In operation 930, the second charger 500 according to an embodiment (e.g., the second selection circuit 540) may determine whether there is a smaller value among the fourth control signal and the fifth control signal. When there is a smaller value among the fourth control signal and the fifth control signal (930—Yes), the second charger 500 according to an embodiment (e.g., the second selection circuit 540) may increase, in operation 940, the resistance of the MOSFET 510 based on the smaller value among the fourth control signal and the fifth control signal. When the resistance of the MOSFET 510 according to an embodiment is increased, the voltage of the interface 470 may be increased.

The electronic device according to various embodiments may be one of various types of electronic devices. The electronic devices may include, for example, a portable communication device (e.g., a smartphone), a computer device, a portable multimedia device, a portable medical device, a camera, a wearable device, a home appliance, or the like. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used in connection with various embodiments of the disclosure, the term "module" may include a unit implemented in hardware, software, or firmware, or any combination thereof, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 240) including one or more instructions that are stored in a storage medium (e.g., internal memory 236 or external memory 238) that is readable by a machine (e.g., the electronic device 201). For example, a processor (e.g., the processor 220) of the machine (e.g., the electronic device 201) may invoke at least one of the one or more instructions stored in the storage medium, and execute it. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the "non-transitory" storage medium is a tangible device, and may not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may also be separately disposed in different components. According to various embodiments, one or more of the above-described components or operations may be omitted, or one or more other components or operations may be added. Alternatively or additionally, a plurality of components (e.g., modules or programs) may be integrated into a single component. In such a case, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents. It will also be understood that any of the embodiment(s) described herein may be used in conjunction with any other embodiment(s) described herein.

What is claimed is:

1. An electronic device comprising:
   an interface including contacts for charging an external electronic device;
   a current reference control circuit; and
   a charging current control circuit configured to control a magnitude of a charging current applied to the interface for charging the external electronic device based on a control signal resulting from a comparison between a charging current value applied to the interface and a first critical current value configured in the current reference control circuit,
   wherein the current reference control circuit is configured to:
   gradually decrease the first critical current value based on a voltage value applied to the interface reaching a first critical voltage value, and
   maintain the first critical current value based on the voltage value applied to the interface being less than the first critical voltage value.

2. The electronic device of claim 1, further comprising: a comparator configured to compare the voltage value applied to the interface with the first critical voltage value,
   wherein the comparator is configured to output a high signal to the current reference control circuit based on the voltage value applied to the interface reaching the first critical voltage value.

3. The electronic device of claim 1, further comprising: a first error amplifier configured to determine and amplify an error between the charging current value applied to the interface and the first critical current value,
   wherein the first error amplifier is configured to output, as a first control signal, a value of the error amplified by the first error amplifier to a first selection circuit or a charging current control circuit.

4. The electronic device of claim 3, further comprising: a second error amplifier configured to determine and amplify an error between the voltage value applied to the interface and the first critical voltage value,
   wherein the second error amplifier is configured to output, as a second control signal, a value of the error amplified by the second error amplifier to the first selection circuit or the charging current control circuit.

5. The electronic device of claim 4, wherein
   the first selection circuit is configured to compare errors included in the first control signal and the second control signal and output, as a third control signal, a control signal of one error amplifier which outputs a smaller value among the value output by the first error amplifier and the value output by the second error amplifier, and
   the charging current control circuit is configured to control the magnitude of the charging current applied to the interface, based on the third control signal.

6. The electronic device of claim 5, wherein the charging current control circuit is further configured to control the magnitude of the charging current applied to the interface by adjusting a pulse width of the charging current based on a magnitude of an error value included in the third control signal, based on the third control signal being received from the first selection circuit.

7. The electronic device of claim 1, wherein the voltage value applied to the interface is increased based on a resistance of a MOSFET included in the external electronic device being increased.

8. The electronic device of claim 7, wherein the external electronic device comprises:
a third error amplifier configured to: determine and amplify an error between a battery current value of the external electronic device and a second critical current value, and output a fourth control signal comprising a value of the amplified error;
a fourth error amplifier configured to: determine and amplify an error between a battery voltage value of the external electronic device and a second critical voltage value, and output a fifth control signal comprising a value of the amplified error; and
a second selection circuit electrically connected to the third error amplifier and the fourth error amplifier and configured to receive the fourth control signal and the fifth control signal, and to output a sixth control signal, based on the fourth control signal and the fifth control signal,
wherein a resistance value of the MOSFET is controlled based on the sixth control signal output from the second selection circuit.

9. The electronic device of claim 1, wherein the external electronic device is an ear-wearable device.

10. The electronic device of claim 1, wherein the interface includes only two contacts for charging the external electronic device.

11. The electronic device of claim 1, wherein the interface is configured to charge a plurality of external electronic devices, and each external electronic device is connected to the interface via two contacts.

12. The electronic device of claim 1, further comprising:
a first error amplifier configured to amplify an error between the charging current value applied to the interface and the first critical current value, and output, as a first control signal, a value of the error amplified by the first error amplifier to a first selection circuit or a charging current control circuit; and
a second error amplifier configured to amplify an error between the voltage value applied to the interface and the first critical voltage value, and output, as a second control signal, a value of the error amplified by the second error amplifier to the first selection circuit or the charging current control circuit,
wherein the first selection circuit is configured to output, as a third control signal, a control signal of one error amplifier which outputs a smaller value among the value output by the first error amplifier and the value output by the second error amplifier, and
wherein the charging current control circuit is configured to control the magnitude of the charging current applied to the interface based on the third control signal.

13. The electronic device of claim 1, further comprising:
a first error amplifier configured to output a first control signal corresponding to an error between the charging current value applied to the interface and the first critical current value;
a second error amplifier configured to output a second control signal corresponding to an error between the voltage value applied to the interface and the first critical voltage value; and
a selection circuit configured to output a third control signal corresponding to a smaller value among the first control signal and the second control signal for controlling the magnitude of the charging current applied to the interface.

14. A method for controlling an electronic device comprising an interface comprising including contacts for charging an external electronic device, the method comprising:
based on a voltage value applied to the interface of the electronic device reaching a first critical voltage value, gradually decreasing a first critical current value by a current reference control circuit of the electronic device until the voltage value applied to the interface falls below the first critical voltage value; and
maintaining the first critical current value by the current reference control circuit of the electronic device based on the voltage value applied to the interface being less than the first critical voltage value,
wherein the electronic device comprises: a charging current control circuit configured to control a magnitude of a charging current applied to the interface for charging the external electronic device based on a control signal resulting from a comparison between a charging current value applied to the interface and the first critical current value of the current reference control circuit.

15. The method of claim 14, wherein the electronic device further comprises a comparator configured to compare the voltage value applied to the interface with the first critical voltage value,
wherein the comparator is configured to output a high signal to the current reference control circuit based on the voltage value applied to the interface reaching the first critical voltage value.

16. The method of claim 14, wherein the electronic device further comprises a first error amplifier configured to determine and amplify an error between the charging current value applied to the interface and the first critical current value,
wherein the first error amplifier is configured to output, as a first control signal, a value of the error amplified by the first error amplifier to a first selection circuit.

17. The method of claim 16, wherein the electronic device further comprises a second error amplifier configured to determine and amplify an error between the voltage value applied to the interface and the first critical voltage value,
wherein the second error amplifier is configured to output, as a second control signal, a value of the error amplified by the second error amplifier to the first selection circuit.

18. The method of claim 17, wherein
the first selection circuit is configured to compare errors included in the first control signal and the second control signal and output, as a third control signal, a control signal of one error amplifier which outputs a smaller value among the value output by the first error amplifier and the value output by the second error amplifier, and
the charging current control circuit is configured to control the magnitude of the charging current applied to the interface, based on the third control signal.

19. The method of claim 18, wherein the charging current control circuit is further configured to control the magnitude of the charging current applied to the interface by adjusting a pulse width of the charging current based on a magnitude of an error value included in the third control signal, based on the third control signal being received from the first selection circuit.

20. The method of claim 14, wherein the voltage value applied to the interface is increased based on a resistance of a MOSFET included in the external electronic device being increased.

* * * * *